(12) United States Patent
Park et al.

(10) Patent No.: US 7,907,454 B2
(45) Date of Patent: Mar. 15, 2011

(54) METHOD OF VERIFYING PROGRAMMING OPERATION OF FLASH MEMORY DEVICE

(75) Inventors: Min-Gun Park, Yongin-si (KR);
Jin-yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 342 days.

(21) Appl. No.: 12/247,288

(22) Filed: Oct. 8, 2008

(65) Prior Publication Data
US 2009/0175087 A1 Jul. 9, 2009

(30) Foreign Application Priority Data

Jan. 4, 2008 (KR) .......................... 10-2008-0001427

(51) Int. Cl.
G11C 16/06 (2006.01)

(52) U.S. Cl. .......... 365/185.22; 365/185.24; 365/185.25

(58) Field of Classification Search ............ 365/185.22, 365/185.24, 185.25, 185.18, 185.17
See application file for complete search history.

(56) References Cited

U.S. PATENT DOCUMENTS

| 6,857,585 B2 * | 2/2005 | Winner ..................... 239/533.2 |
| 7,266,016 B2 | 9/2007 | Kameda |
| 7,372,742 B2 * | 5/2008 | Aritome .................. 365/185.29 |
| 2008/0062760 A1 * | 3/2008 | Kim ........................ 365/185.03 |

FOREIGN PATENT DOCUMENTS

| JP | 2006-146989 | 6/2006 |
| KR | 1020070033667 A | 3/2007 |

* cited by examiner

Primary Examiner — Gene N. Auduong
(74) Attorney, Agent, or Firm — Volentine & Whitt, P.L.L.C.

(57) ABSTRACT

A method is provided for verifying a programming operation of a flash memory device. The flash memory device includes at least one memory string in which a string selection transistor, multiple memory cells and a ground selection transistor are connected in series, and the programming operation is performed with respect to a selected memory cell in the memory string. The method includes applying a voltage, obtained by adding a threshold voltage of the string selection transistor to a power supply voltage, to a string selection line connected to the string selection transistor; applying a ground voltage to wordlines connected to each of the memory cells and a ground selection line connected to the ground selection transistor; precharging a bitline connected to the memory string to the power supply voltage; and determining whether a programming operation of the selected memory cell is complete.

11 Claims, 7 Drawing Sheets

METHOD OF VERIFYING PROGRAMMING OPERATION OF FLASH MEMORY DEVICE

CROSS-REFERENCE TO RELATED PATENT APPLICATIONS

A claim of priority is made to Korean Patent Application No. 10-2008-0001427, filed on Jan. 4, 2008, in the Korean Intellectual Property Office, the subject matter of which is hereby incorporated by reference.

BACKGROUND

1. Field of the Invention

The present invention relates to a nonvolatile flash memory device, and more particularly, to a method of verifying programming of a nonvolatile flash memory device.

2. Description of the Related Art

Data can be programmed in and erased from flash memory devices using a tunneling phenomenon. Such flash memory devices are appropriate for use as auxiliary memory devices for mobile phones and other mobile devices, for example, due to high data retention, low power consumption, and strong durability with respect to external shocks. In NAND flash memory devices, in which a predetermined number of memory cells are connected in series, the size of a memory cell is smaller than the size of a memory cell of NOR flash memory devices, in which a predetermined number of memory cells are connected in parallel. Thus, NAND flash memory devices have a higher degree integration and are more useful as auxiliary memory devices with large capacity.

In NAND flash memory devices, multiple memory cells connected in series to one bitline constitute one string, and the string is divided into blocks having multiple pages based on memory cells connected to one wordline. In NAND flash memory devices having the above structure, a read operation and a program operation are performed in one page unit, and an erase operation is performed in one block unit.

Figure 1:
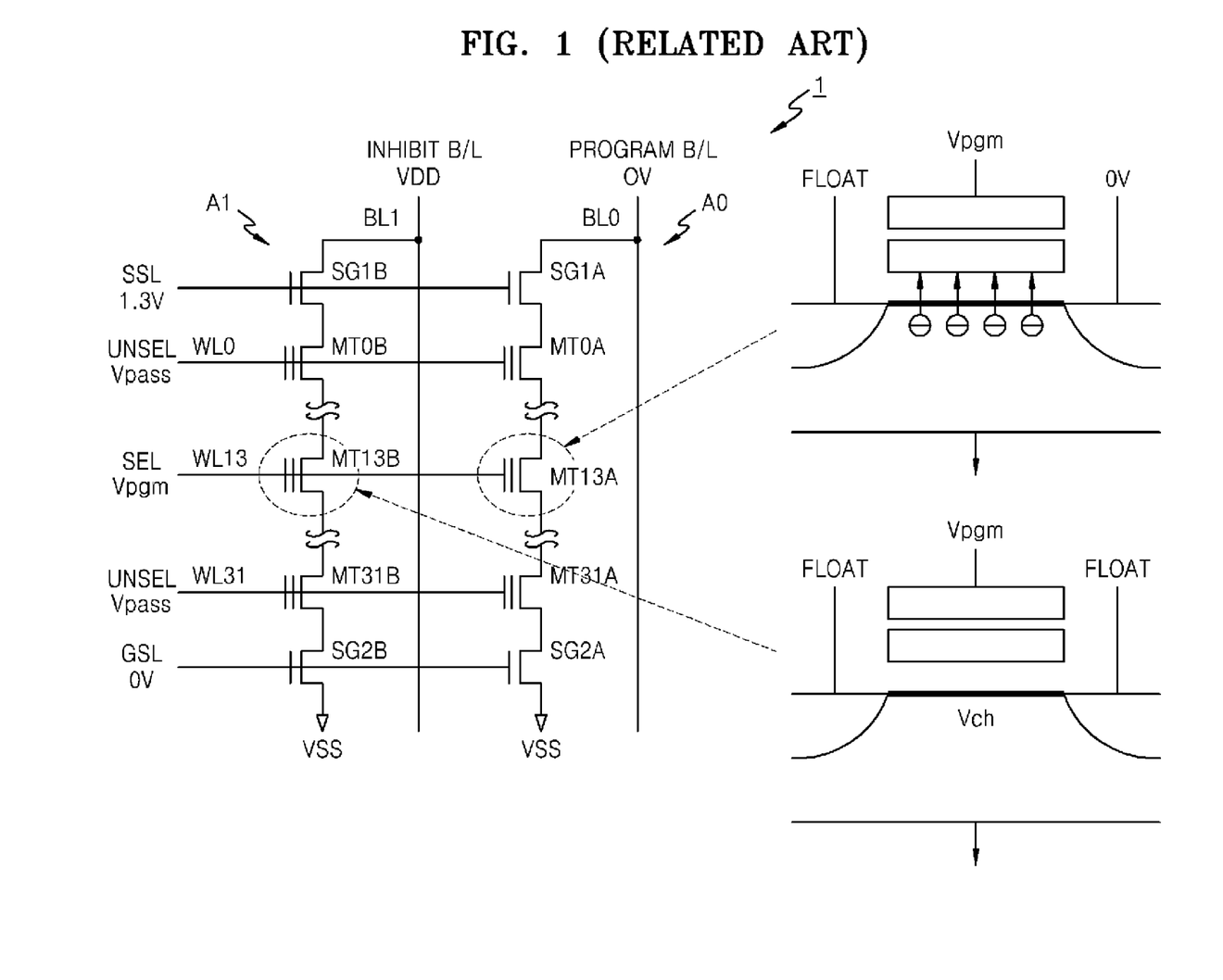
FIG. 1 is a circuit diagram and sectional diagrams for illustrating a conventional method of applying a voltage during a program operation of a NAND flash memory device.

FIG. 1 includes a circuit diagram and sectional diagrams for illustrating a conventional method of applying a voltage during a program operation of a NAND flash memory device. Referring to FIG. 1, a memory cell array 1 includes memory strings A0 and A1, each having memory cells connected to common wordlines WL0-WL31. A first memory string A0 is connected to a first bitline BL0, and a second memory string A1 is connected to a second bitline BL1. Memory cell transistors MT0A-MT31A, each having a floating gate, are connected in series to the first memory string A0. The drain of the memory cell transistor MT0A is connected to a first bitline BL0 through a string selection transistor SG1A connected to a string selection line SSL, and the source of the memory cell transistor MT31A is connected to a ground voltage VSS through a ground selection transistor SG2A connected to a ground selection line GSL. Memory cell transistors MT0B-MT31B, each having a floating gate, are connected to the second memory string A1 in series. The drain of the memory cell transistor MT0B is connected to a second bitline BL1 through a string selection transistor SG1B, and the source of the memory cell transistor MT31B is connected to the ground voltage VSS through a ground selection transistor SG2B.

Figure 2:
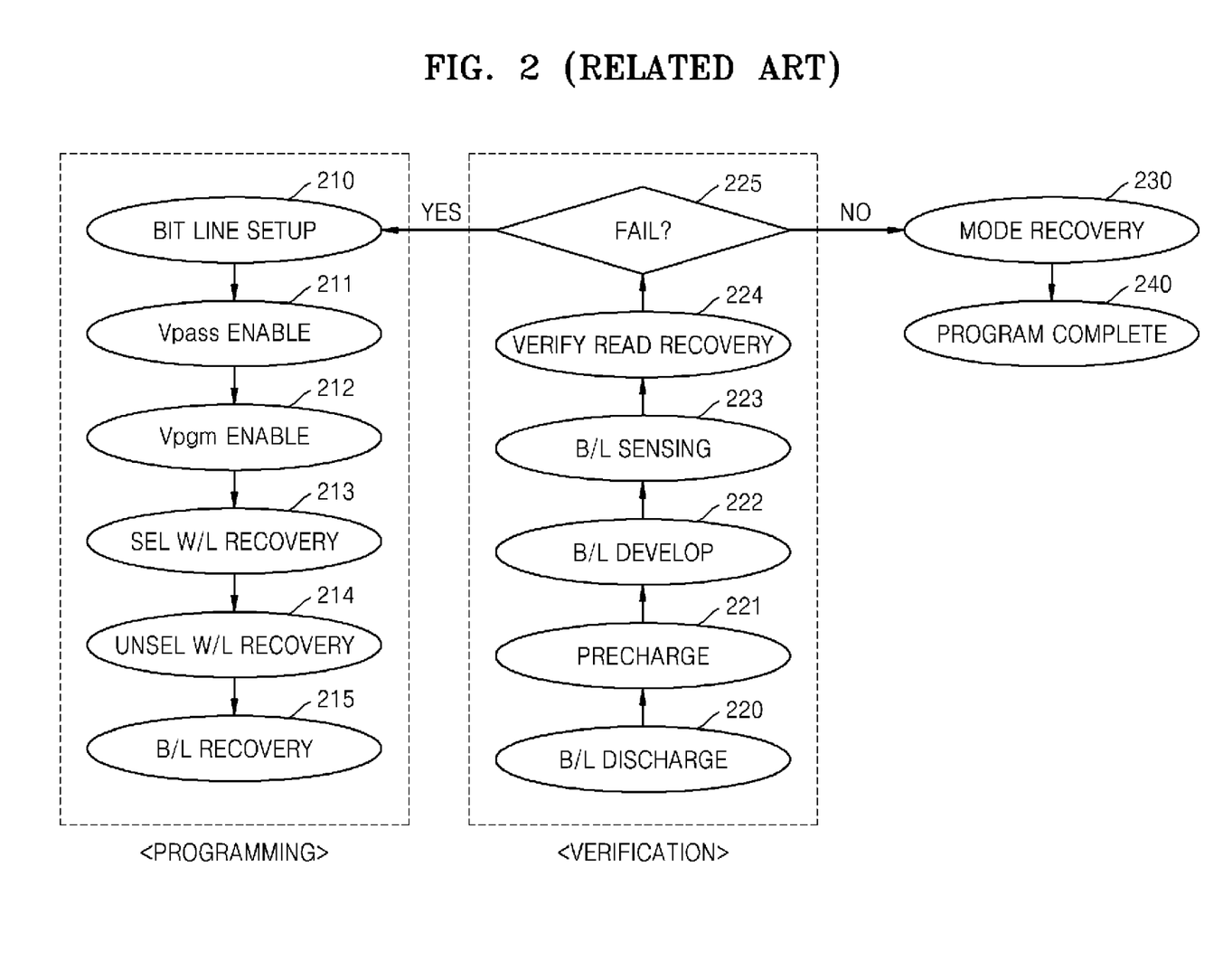
FIG. 2 is a flow diagram illustrating a conventional method of verifying a programming operation.

FIG. 2 is a flow diagram illustrating a conventional method of verifying a programming operation. With reference to FIGS. 1 and 2, a programming operation is performed after an erase operation. For example, assuming that memory cell transistor MT13A of the first memory string A0 is selected for programming, 0V is applied to the first bitline BL0 to set up the bitline BL0 (210), and data to be programmed in the selected memory cell transistor MT13A is loaded into the bitline BL0. The string selection transistor SG1A is turned on so that the first memory string A0 is connected to the first bitline BL0, and the ground selection transistor SG2A is turned off. A program voltage Vpgm of approximately 14-20 V is applied to selected wordline WL13 (212), and a pass voltage Vpass of approximately 7-10 V is applied to unselected wordlines WL0-WL12 and WL14-WL31 (211), for example. Accordingly, in the memory cell transistor MT13A, electrons are tunneled to a floating gate from a channel, so that a threshold voltage increases to a positive value. After programming, the selected wordline WL13 and the unselected wordlines WL0-WL12 and WL14-WL31 are recovered, for example, to the ground voltage VSS (213, 214). The bitline BL0 is likewise recovered (215).

Since the program operation is performed in one page unit, when the program voltage Vpgm is applied to the selected wordline WL13 in FIG. 1, the same program voltage Vpgm is applied to the gate of the memory cell transistor MT13B that belongs to the second memory string A1, which is not selected. In other words, the memory cell MT13A to be programmed and the memory cell MT13B not to be programmed (hereinafter, referred to as "a program inhibit cell") are connected to one wordline WL13 within one page, and the program voltage Vpgm is applied to the selected wordline WL13. Thus, the program inhibit cell MT13B may be soft programmed by the program voltage Vpgm. This is referred to as program disturbance.

In order to prevent program disturbance of the program inhibit cell MT13B, a power supply voltage VDD is applied to the second bitline BL1, and a channel voltage is increased using self-boosting due to capacitive coupling between the gate and the channel. As a result, a voltage difference between the gate of the program inhibit cell MT13B and the channel is sufficiently reduced so that electrons are not tunneled to the floating gate and program disturbance of the program inhibit cell MT13B is prevented.

Channel voltages of the first and second memory strings A0 and A1 depend on the pass voltage Vpass supplied to each of the unselected wordlines WL0-WL12 and WL14-WL31. As the pass voltage Vpass increases, a state where the program inhibit cell MT13B is soft programmed may be avoided. However, as the pass voltage Vpass increases to prevent program disturbance, the memory cells connected to each of the unselected wordlines WL0-WL12 and WL14-WL31 may be soft programmed by the pass voltage Vpass. This is referred to as pass disturbance. Thus, the pass voltage Vpass is determined in consideration of program disturbance and pass disturbance conditions, and has characteristics as shown in pass voltage window (W1) of FIG. 3, for example, indicating a number of failed bits as a function of increasing pass voltage Vpass.

Referring back to FIG. 2, after all of the memory cells are programmed, an operation of verifying whether corresponding memory cells are correctly programmed is performed. The verification operation includes a program recovery operation followed by a verification read operation. The program recovery operation includes discharging a bitline (220) and precharging the bitline (221) in order to set a bitline voltage to a predetermined value so as to read data. The verification read operation includes developing data of the bitline (222), sensing the data of the bitline (223) and verifying, reading and recovering the data of the bitline (224) in order to read and latch the data of the bitline.

When at least one of the memory cells is not sufficiently programmed (failed) (225), the program operation is repeatedly performed a predetermined number of times. The program voltage used in the next loop program operation is set higher than the program voltage used in the previous loop program operation. The selected memory cells may thus be re-programmed. Passing the memory cells results in mode recovery (230) and the program operation is complete (240).

Figure 4:
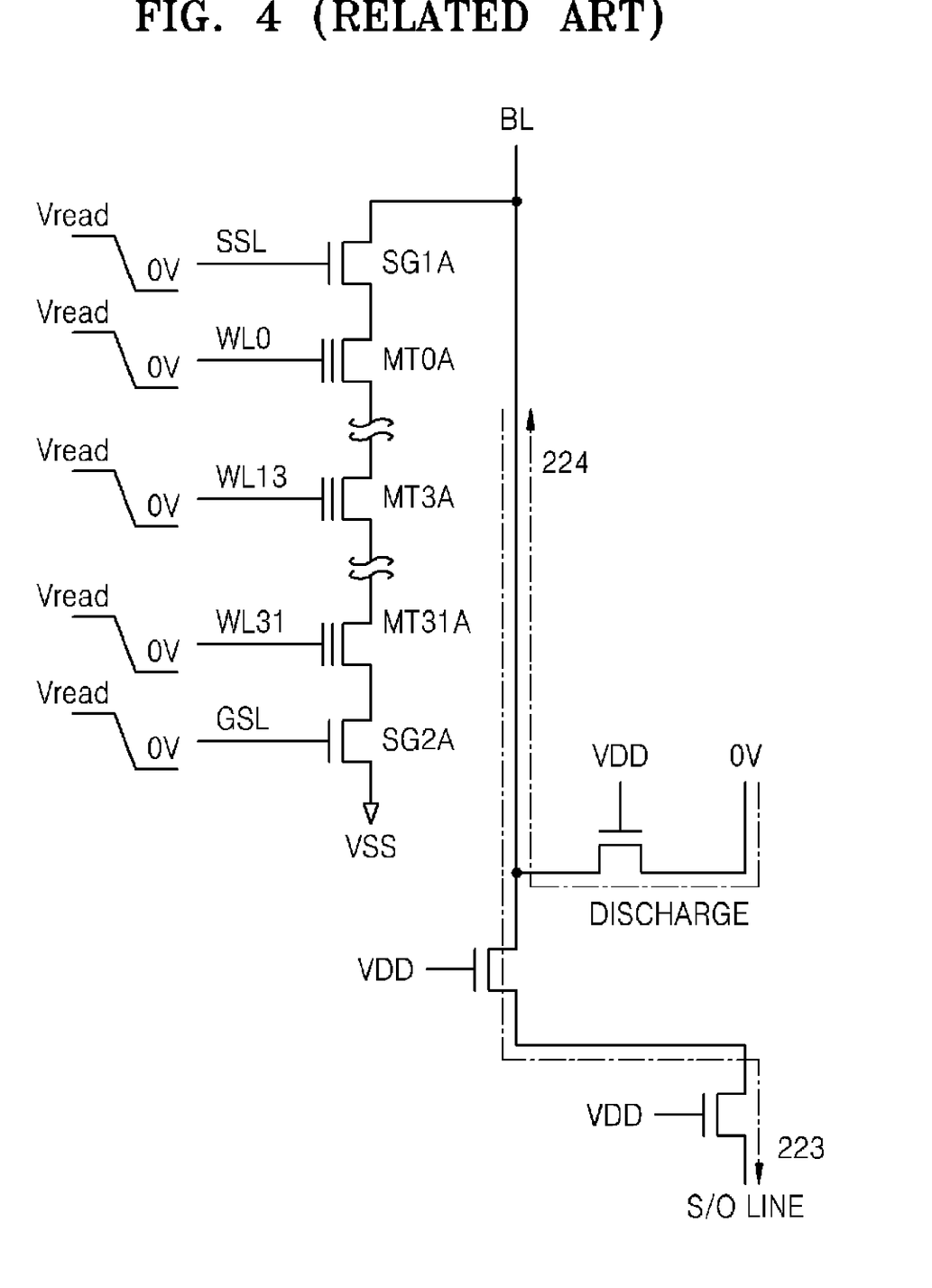
FIG. 4 is a circuit diagram for illustrating a conventional method of applying a voltage, including a bitline data sensing operation and a verification read recovery operation of a verification read operation shown in FIG. 2.

FIG. 4 is a circuit diagram for illustrating a conventional method of applying a voltage, including the bitline data sensing operation (223) and the verification read recovery operation (224) of the verification read operation shown in FIG. 2. Referring to FIG. 4, in the bitline data sensing operation (223), for example, a read voltage Vread of approximately 4.5 V is applied to a string selection line SSL, wordlines WL0-WL31, and a ground selection line GSL so that data of the bitline BL is sensed. In the subsequent verification read recovery operation (224), the bitline BL is discharged to a ground voltage 0V.

If a memory cell MT13A to be programmed is not sufficiently programmed, after the verification read recovery operation (224), during a next program loop operation, the pass voltage Vpass is applied to memory cells connected to each of the unselected wordlines WL0-WL12 and WL14-WL31. In this case, since channel voltages of the first and second memory strings A0 and A1 are boosted from the ground voltage 0V, the pass voltage Vpass must be increased.

Figure 3:
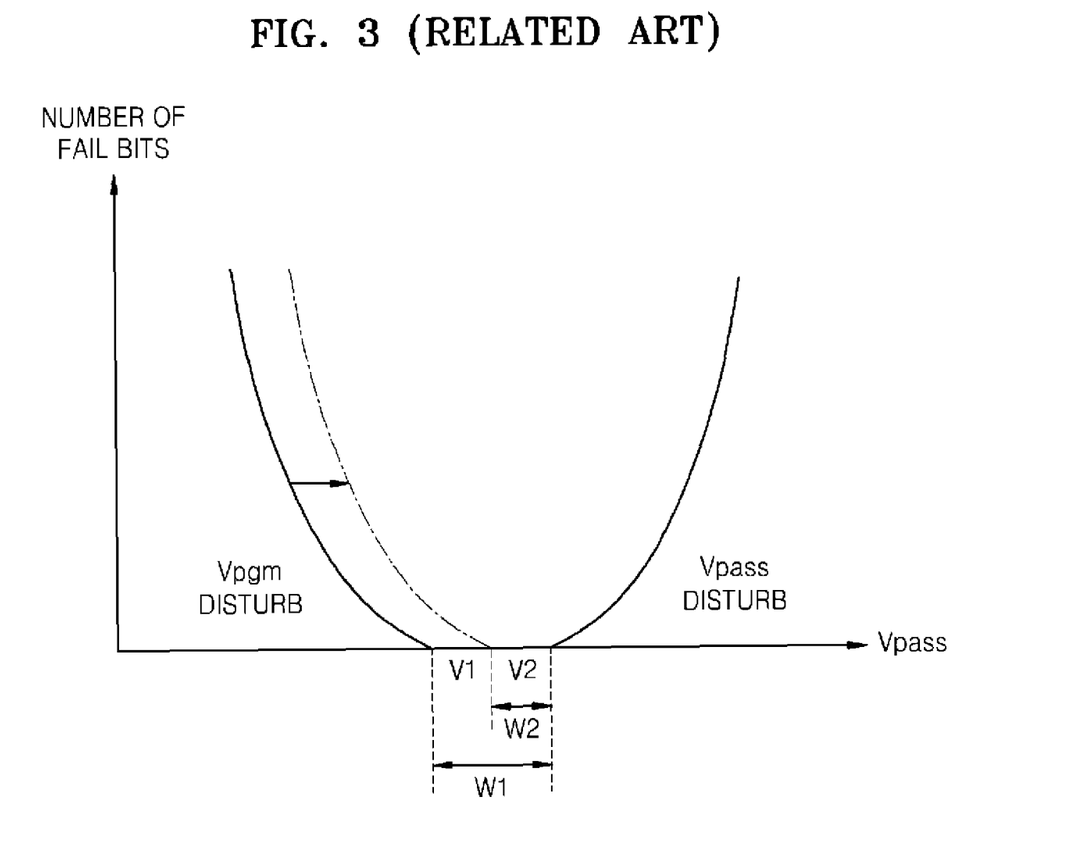
FIG. 3 is a graph illustrating distribution of a pass voltage window according to the method of FIG. 2.

Furthermore, due to large-capacity and high-speed applications, in order to achieve higher cell density in the same chip size, the size of a block, which is an erase operation unit of a NAND flash memory device, and the size of a page, which is a read and program operation unit, are increased. As page units increase in size, the pass voltage for avoiding a program disturbance in a memory cell increases. As such, a programming operation occurs in which a pass voltage window is reduced (W2<W1), as shown in FIG. 3.

SUMMARY

The various embodiments of the present invention provide a method of verifying a programming operation of a flash memory device. Accordingly, a wide pass voltage window may be obtained.

According to an aspect of the present invention, there is provided a method of verifying a programming operation of a flash memory device, which includes at least one memory string in which a string selection transistor, multiple memory cells and a ground selection transistor are connected in series, and wherein the programming operation is performed with respect to a selected memory cell in the memory string. The method includes (a) applying a voltage, obtained by adding a threshold voltage of the string selection transistor to a power supply voltage, to a string selection line connected to the string selection transistor; (b) applying a ground voltage to wordlines connected to each of the memory cells and a ground selection line connected to the ground selection transistor; (c) precharging a bitline connected to the memory string to the power supply voltage; and (d) determining whether a programming operation of the selected memory cell is complete.

The method may further include, before step (a), loading data to be programmed in the selected memory cell into the bitline; applying a program voltage to a selected wordline connected to the selected memory cell and applying a pass voltage to unselected wordlines to program the selected memory cell; recovering the wordlines to the ground voltage after the programming; and applying a read voltage to the string selection line, the unselected wordlines, and the ground selection line, respectively, and applying a verification voltage to the selected wordline to sense data of the bitline connected to the memory string. The read voltage may be set to be higher than the power supply voltage.

The method may further include applying a program voltage to a wordline of the selected memory cell and applying a pass voltage to wordlines of unselected memory cells to re-program the selected memory cell.

The program voltage and the pass voltage may be set higher than the power supply voltage. Also, the program voltage may be set higher than the pass voltage.

In methods for verifying a programming operation of a flash memory device according to embodiments of the present invention, when the selected memory cell in the memory string is not correctly programmed, the memory cell may be re-programmed after the bitline connected to the memory string is precharged to the power supply voltage. Since the channel voltage of the memory string is precharged to the power supply voltage, during re-programming, channel boosting efficiency is high even when pass voltage is reduced. Accordingly, the pass voltage window of the flash memory device is widened.

BRIEF DESCRIPTION OF THE DRAWINGS

The embodiments of the present invention will be described with reference to the attached drawings, in which.

DETAILED DESCRIPTION OF THE EMBODIMENTS

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 5:
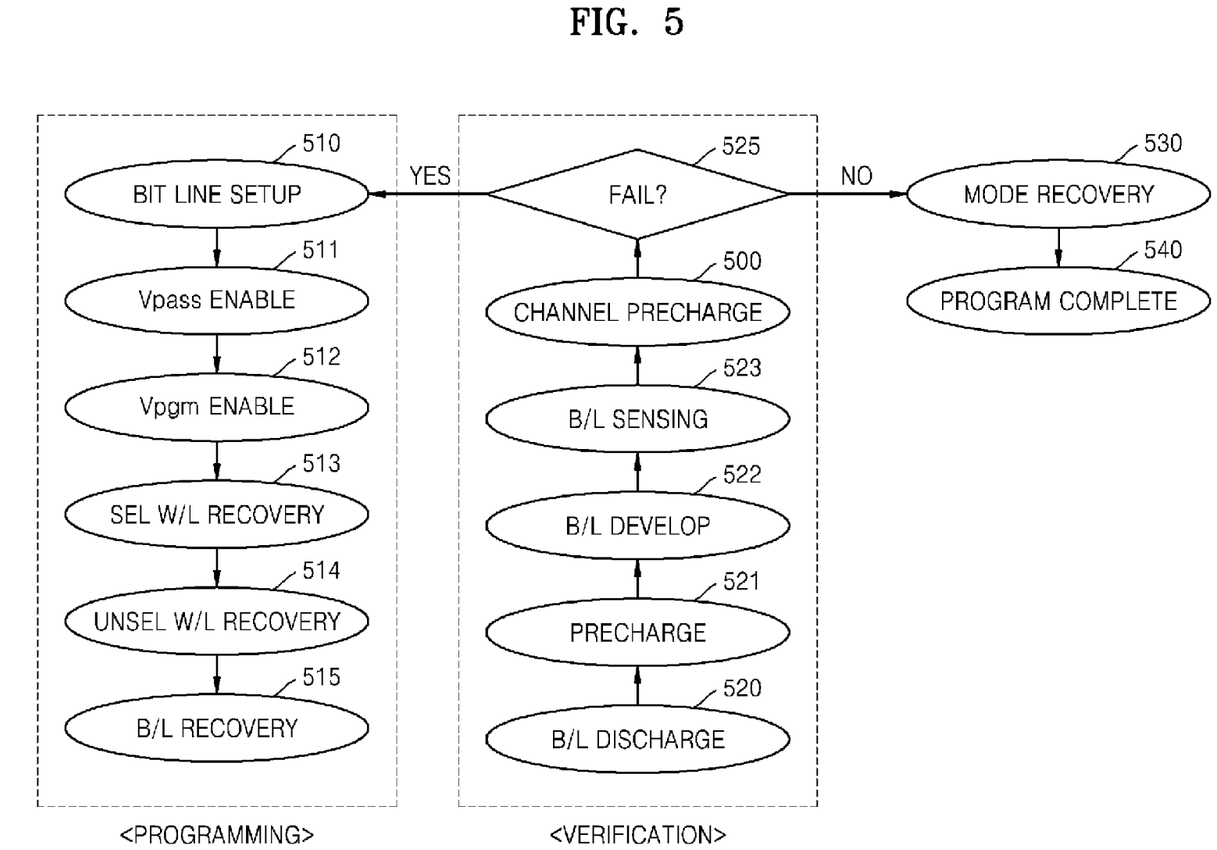
FIG. 5 is a flow diagram illustrating a method of verifying a programming operation, according to an embodiment of the present invention.

FIG. 5 is a flow diagram showing a method of verifying a programming operation, according to an illustrative embodiment of the present invention. The method illustrated in FIG. 5 includes a channel precharge operation (500), in which a bitline BL is precharged to a power supply voltage VDD, instead of the verification read recovery operation (224) illustrated in FIG. 2, for example, in which the bitline BL is discharged to a ground voltage 0V.

The embodiment depicted in FIG. 5 will be described, in part, with reference to the illustrative configuration of a flash memory device shown in FIG. 1, for the sake of convenience, although it is understood that the method may be implemented using other flash memory configurations. FIG. 5 shows a programming operation performed after an erase operation. For example, assuming a memory cell transistor MT13A of the first memory string A0 is selected for programming, 0V is applied to a first bitline BL0 to set up the bitline BL0 (510), and data to be programmed in the selected memory cell transistor MT13A is loaded into the bitline BL0. The string selection transistor SG1A is turned on so that the first memory string A0 is connected to the first bitline BL0, and the ground selection transistor SG2A is turned off. A pass voltage Vpass of approximately 7-10 V is applied to unselected wordlines WL0-WL12 and WL14-WL31 (511) and a program voltage Vpgm of approximately 14-20 V is applied to selected wordline WL13 (512), for example. Accordingly, in the selected memory cell transistor, electrons are tunneled to a floating gate from a channel, so that a threshold voltage increases to a positive value. After programming, the selected wordline WL13 and the unselected wordlines WL0-WL12 and WL14-WL31 are recovered, for example, to the ground voltage VSS (513, 514), and the bitline BL0 is likewise recovered (515).

After the memory cells are programmed, an operation of verifying whether corresponding memory cells are correctly programmed is performed. The verification operation includes a program recovery operation followed by a verification read operation. The program recovery operation includes discharging a bitline (520) and precharging the bitline (521) in order to set a bitline voltage to a predetermined value so as to read data. The verification read operation includes developing data of the bitline (522), sensing the data of the bitline (523) and performing a channel precharge operation (500), discussed below.

When at least one of the memory cells is not sufficiently programmed (failed) (525), the program operation may be repeatedly performed a predetermined number of times. The program voltage used in the next loop program operation is incrementally changed (e.g., set higher) from the program voltage used in the previous loop program operation. The selected memory cells may thus be re-programmed. Passing the memory cells results in mode recovery (530) and the program operation is complete (540).

Figure 6:
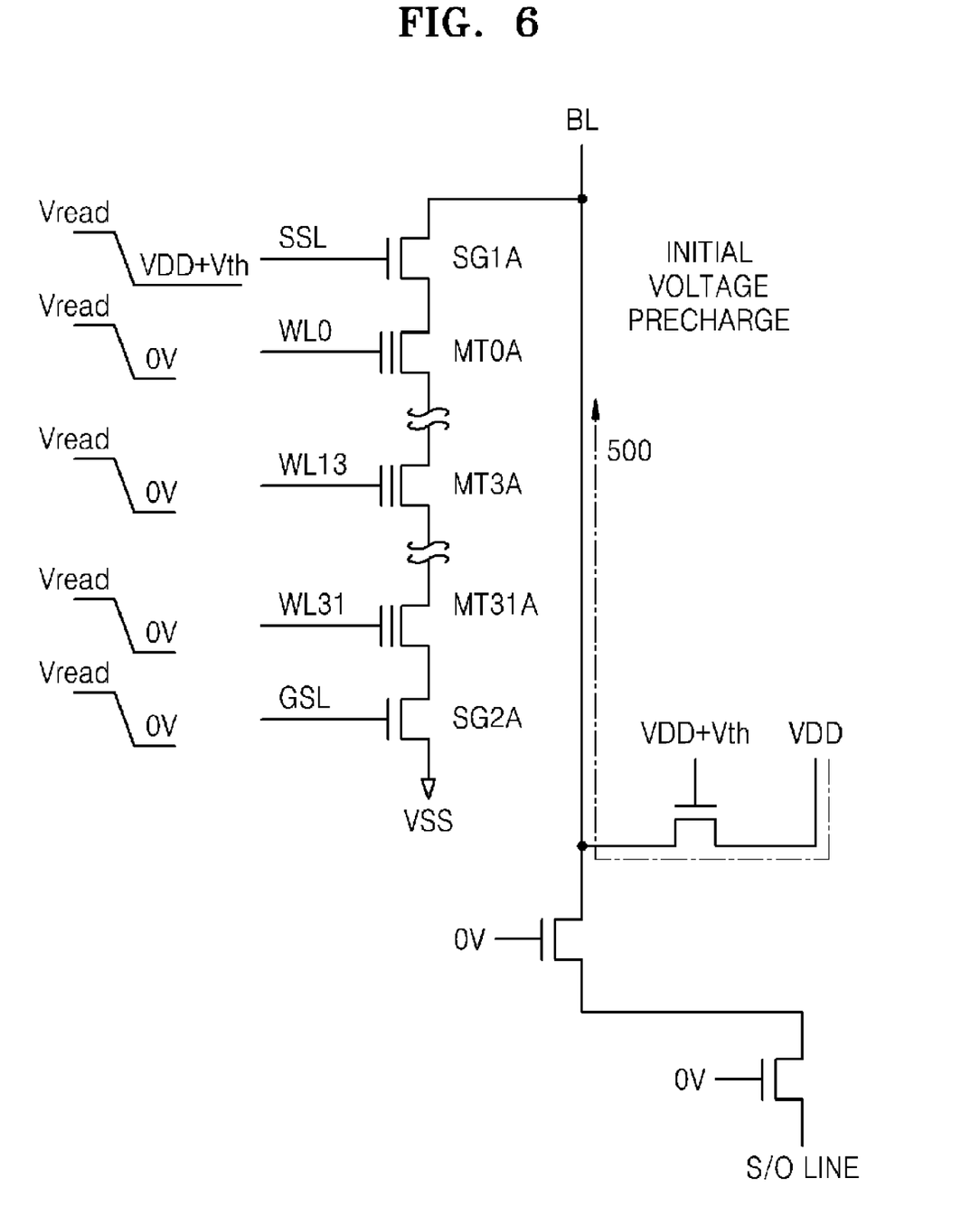
FIG. 6 is a circuit diagram for illustrating a method of applying a voltage in a bitline data sensing operation and the channel precharge operation shown in FIG. 5, according to an embodiment of the present invention.

FIG. 6 is a circuit diagram for illustrating a method of applying a voltage in the channel precharge operation (500) shown in FIG. 5, according to an illustrative embodiment. Referring to FIG. 5, in the bitline data sensing operation (523), for example, a read voltage Vread of approximately 4.5 V is applied to a string selection line SSL, wordlines WL0-WL31, and a ground selection line GSL so that data of the bitline BL is sensed. Alternatively, a verification voltage may be applied to the selected wordline WL13. In the channel precharge operation (500), the bitline BL is precharged to the power supply voltage VDD, and a voltage VDD+Vth, obtained by adding a threshold voltage Vth of a string selection transistor SG1A to the power supply voltage VDD, is applied to the string selection line SSL.

Figure 7:
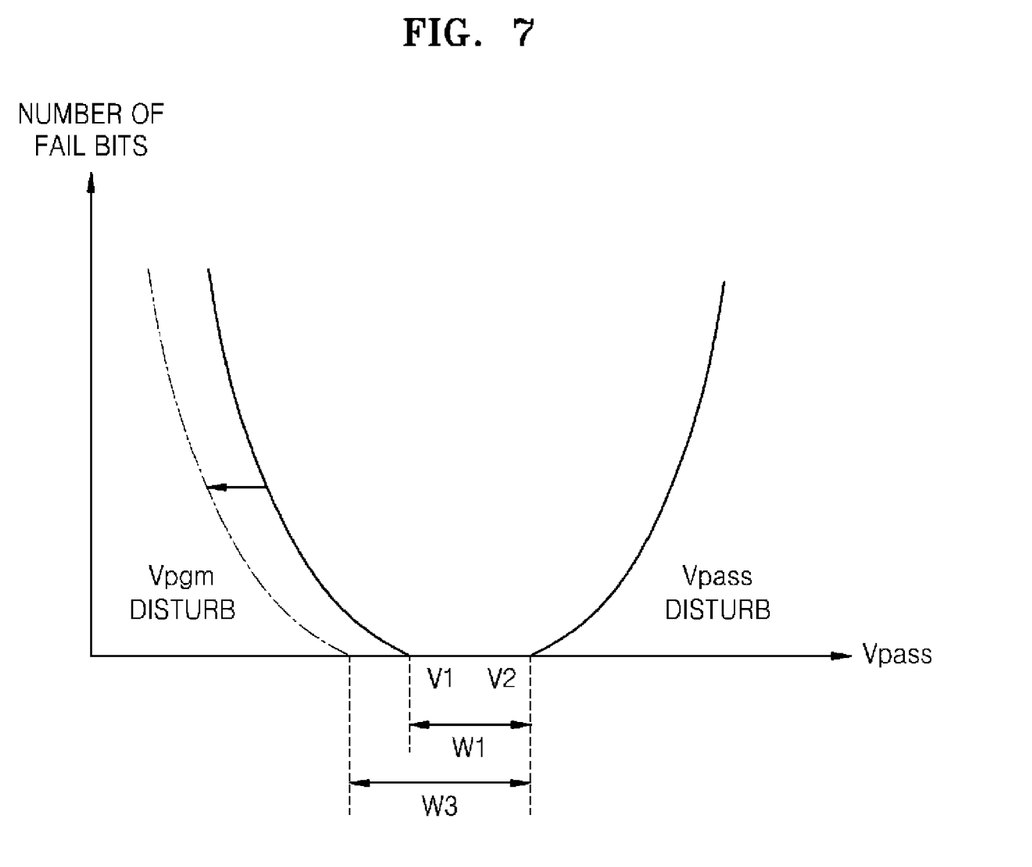
FIG. 7 a graph illustrating distribution of a pass voltage window according to the method of FIG. 5, according to an embodiment of the present invention.

After the channel precharge operation (500), during a next loop programming operation, a pass voltage Vpass is applied to memory cells connected to each of unselected wordlines WL0-WL12 and WL14-WL31. In this case, since channel voltages of memory strings A0 and A1 have been precharged to the power supply voltage VDD, channel boosting efficiency is high, even when the pass voltage Vpass is reduced. Accordingly, the pass voltage window of the flash memory device is widened, as illustrated in FIG. 7. In particular, the pass voltage Vpass for avoiding a program disturbance is reduced, indicated by pass voltage window (W3). Accordingly, comparison of the pass voltage windows of FIG. 7 and FIG. 3 shows that W3>W1.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of verifying a programming operation of a flash memory device, the flash memory device comprising at least one memory string in which a string selection transistor, a plurality of memory cells and a ground selection transistor are connected in series, wherein the programming operation is performed with respect to a selected memory cell in the memory string, the method comprising:
   (a) applying a voltage, obtained by adding a threshold voltage of the string selection transistor to a power supply voltage, to a string selection line connected to the string selection transistor;
   (b) applying a ground voltage to wordlines connected to each of the memory cells and a ground selection line connected to the ground selection transistor;
   (c) precharging a bitline connected to the memory string to the power supply voltage; and
   (d) determining whether a programming operation of the selected memory cell is complete.

2. The method of claim 1, further comprising, before (a):
   (a-1) loading data to be programmed in the selected memory cell into the bitline;
   (a-2) applying a program voltage to a selected wordline connected to the selected memory cell and applying a pass voltage to unselected wordlines to program the selected memory cell;
   (a-3) after the programming, recovering the wordlines to the ground voltage; and
   (a-4) applying a read voltage to the string selection line, the wordlines, and the ground selection line, respectively, to sense data of the bitline connected to the memory string.

3. The method of claim 2, wherein the read voltage is set to be higher than the power supply voltage.

4. The method of claim 1, further comprising:
   applying a program voltage to a wordline of the selected memory cell and applying a pass voltage to wordlines of unselected memory cells to re-program the selected memory cell.

5. The method of claim 4, wherein the program voltage and the pass voltage are set to be higher than the power supply voltage.

6. The method of claim 5, wherein the program voltage is set to be higher than the pass voltage.

7. A method of verifying a programming operation of a flash memory device, the flash memory device comprising at least one string connected to a bitline, the string having a string selection transistor, a plurality of memory cells and a ground selection transistor connected in series, the method comprising:
   programming a selected memory cell of the plurality of memory cells;
   applying a voltage to a string selection line connected to the string selection transistor, the voltage comprising a sum of a threshold voltage of the string selection transistor and a power supply voltage;

applying a ground voltage to wordlines connected to each of the plurality of memory cells and a ground selection line connected to the ground selection transistor;

precharging the bitline connected to the string to the power supply voltage; and determining whether the selected memory cell is sufficiently programmed.

8. The method of claim 7, further comprising:

when the selected memory cell is not sufficiently programmed, re-programming the selected memory cell using a higher program voltage.

9. The method of claim 7, further comprising:

before applying the voltage to the string selection line, loading data to be programmed in the selected memory cell into the bitline;

applying a program voltage to a selected wordline connected to the selected memory cell and applying a pass voltage to unselected wordlines connected to unselected memory cells of the plurality of memory cells to program the selected memory cell; and recovering the wordlines to the ground voltage after programming the selected memory cell.

10. The method of claim 9, further comprising:

applying a read voltage to the string selection line, the wordlines and the ground selection line, respectively, to sense data of the bitline connected to the memory string.

11. The method of claim 10, wherein the read voltage is higher than the power supply voltage.

\* \* \* \* \*